United States Patent [19]

Takeuchi

[11] Patent Number: 5,200,579
[45] Date of Patent: Apr. 6, 1993

[54] CIRCUIT BOARD WITH CONDUCTIVE PATTERNS FORMED OF THERMOPLASTIC AND THERMOSETTING RESINS

[75] Inventor: Megumu Takeuchi, Yokohama, Japan

[73] Assignee: Toshiba Lighting & Technology Corporation, Tokyo, Japan

[21] Appl. No.: 677,301

[22] Filed: Mar. 29, 1991

[30] Foreign Application Priority Data

Mar. 30, 1990 [JP] Japan ................................ 2-83855

[51] Int. Cl.⁵ ............................................. H05K 1/00
[52] U.S. Cl. .................................. 174/256; 174/262; 174/266
[58] Field of Search ............... 174/256, 254, 255, 250, 174/257, 262, 264

[56] References Cited

U.S. PATENT DOCUMENTS

| 4,511,757 | 4/1985 | Ors | 174/256 |
| 4,751,126 | 6/1988 | Oodaira et al. | 174/256 |
| 4,791,239 | 12/1988 | Shirahata | 174/255 |
| 5,045,141 | 9/1991 | Salensky | 174/257 X |

FOREIGN PATENT DOCUMENTS 0146241 6/1985 European Pat. Off. .
0347824 12/1989 European Pat. Off. .

Primary Examiner—Leo P. Picard
Assistant Examiner—Trinidad Korka
Attorney, Agent, or Firm—Cushman, Darby & Cushman

[57] ABSTRACT

A circuit board comprising a plurality of film substrates in which films having heat deformation properties are laminated one on another, conductive patterns formed on at least one surface of each of the resin films, and connecting portions for electrically connecting the conductive patterns. The connecting portions are formed of parts of the conductive patterns, where the parts of the conductive patterns are made of conductive material including thermoplastic resin, and other parts of said conductive patterns are made of thermosetting resin.

6 Claims, 3 Drawing Sheets

CIRCUIT BOARD WITH CONDUCTIVE PATTERNS FORMED OF THERMOPLASTIC AND THERMOSETTING RESINS

BACKGROUND OF THE INVENTION

1. Field of the Invention

The present invention relates to a circuit board including a multilayer resin film for use in electronic equipment or the like.

2. Description of the Related Art

To lighten, thin, shorten, and miniaturize electronic equipment is particularly desired in household electrical appliances. Such electrical appliances are achieved by reducing the size of their components. An electronic circuit board of the components, is generally formed of glass epoxy board. When high density is required for a circuit board of miniaturized electronic equipment, the circuit board is formed in a multilayer fashion or together with a flexible board, a hybrid IC or the like.

However, the manufacturing of circuit boards, where low cost is desired, a complicated process is used to form through holes in a multilayer (not less than four layers) glass epoxy board, which results in remarkably high cost. An expensive material may be used as the flexible board because of its heat resistance. The above stated problems illustrate the need to improve high density circuit boards.

A circuit board formed of a multilayer resin film has been developed to resolve these problems. It has features of a simple manufacturing process, low cost. three-dimensional wiring.

FIG. 3 (Prior Art) illustrates a conventional circuit board in which resin films 1 have not yet been laminated one on top of another. The resin films 1 have heat deformation properties. Through holes 2 are formed at predetermined positions of the resin films. Conductive patterns 3 and electrodes 4 for connecting the resin films to mounting parts are formed on the surfaces and undersurfaces of the resin films by printing. The resin films 1, conductive patterns 3 and electrodes 4 are heated and pressed by fixed plates 5 of a thermal press (not shown) at a fixed pressure to integrally form a circuit board 6 (see FIG. 4 (Prior Art).

Unlike a normal glass epoxy board, a conductive portion of the circuit board 6 is formed by integrally forming the conductive patterns 3, electrodes 4 and fixed plates 5 by the thermal press. The conductive patterns of each of the resin films are connected to each other by integrally forming the resin films by the thermal press. In other words, they are connected by the flow of resin of the films. The through holes serve to connect the conductive patterns to each other or connect the conductive patterns to the electrodes in the circuit board and are simultaneously formed in a single process. The manufacture of the above-described circuit board does not require such a complicated plating process, as is required for that of the glass epoxy board. The circuit board can thus be manufactured at low cost.

In the manufacture process of the circuit board described above, when the resin films and conductive patterns are thermally pressed, the lower resin films and their conductive patterns are caused to flow by plastic deformation of resin and swell over the through holes (swelling effect).

The conductive patterns protruding from below are connected to the lands (electrodes) around the upper through holes. It is therefore desirable that the resin of the resin films and conductive patterns is sufficiently deformed to connect the conductive patterns to each other.

As described above, since the resin films are connected by deforming the conductive patterns of through hole portions when the films are thermally pressed, the upper and lower conductive patterns, including the resin films, need to be sufficiently deformed. However, the conductive patterns other than those of the through hole portions are also deformed when the resin films are thermally pressed. There is a possibility that the conductive patterns are deformed in their lateral direction as well as in their thickness direction. The intervals between the conductive patterns are not regularly maintained; accordingly, the reliability of the circuit board is lowered.

SUMMARY OF THE INVENTION

One object of the present invention is to provide a circuit board in which the conductive patterns between the upper and lower film substrates are sufficiently connected to each other at an electrically connecting portion and are greatly hardened and deformed at the other portion to prevent adjacent conductive patterns from being short-circuited.

Another object of the present invention is to provide a circuit board formed of a multilayer film which can be manufactured at low cost without using a complicated plating process, such as that required for the manufacture of a glass epoxy board.

According to the present invention, there is provided a circuit board comprising:

a plurality of film substrates in which films having heat deformation properties are laminated one on another;

conductive patterns formed o at least one surface of each of the resin films; and connecting portions for electrically connecting the conductive patterns, the connecting portions being formed of parts of the conductive patterns, the parts of the conductive patterns being made of conductive material including thermoplastic resin, and the other parts of the conductive patterns being made of thermosetting resin.

As one example of a connecting portion according to the present invention, there is a through hole formed in a resin film. A conductive member is inserted into the through hole to connect conductive patterns formed on both surfaces of the resin film. As another example, conductive patterns are formed on the surfaces of two resin films so as to oppose each other, and these resin films are thermally pressed on each other.

Good conductive metal such as Ag, Ni, Cu, Au and Pd can be used as material of the conductive patterns of the present invention. In view of cost, it is desirable to use Ag, Ni and Cu.

Polycarbonate resin, polyvinyl chloride resin, polystyrene resin, saturated polyester resin, polyethylene resin, polypropylene resin, polyphenylene oxide resin, polysulfone resin, polyarylate resin, polyether sulfone resin or the like can be used as heat deformation resin constituting the resin films of the present invention.

Polycarbonate resin, polyvinyl chloride resin, polystyrene resin, saturated polyester resin, polyethylene resin, polypropylene resin, polyphenylene oxide resin, polysulfone resin, polyarylate resin, polyether sulfone resin or the like can be used as thermoplastic resin for constituting thermoplastic resin conductive layers of the present invention. The thermoplastic resin conductive layers can be formed by printing conductive paste using the thermoplastic resin as binder.

Epoxy resin, unsaturated polyester resin, phenolic resin, diallyl phthalate resin or the like can be used as thermosetting resin for constituting thermosetting resin conductive layers. The thermosetting resin conductive layers can be formed by printing conductive paste using the thermosetting resin as binder.

Although, in the aforementioned embodiment, the typical resin materials are listed for the resin film and binder for use in a conductive paste, they can properly be confined together, paying attention to their thermal deformation temperature.

According to the present invention, since the conductive patterns (specifically speaking, the lower and upper land patterns) formed on the major surfaces of the resin films are thermoplastic resin conductive layers in the connecting portions such as through holes, they are sufficiently deformed when the resin films are thermally pressed and connected to each other in an electrically stable state. Since the conductive patterns formed at portions other than the connecting portions are thermosetting resin conductive layers, they are sufficiently hardened by the thermal pressing operation and not greatly deformed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Figure 1:
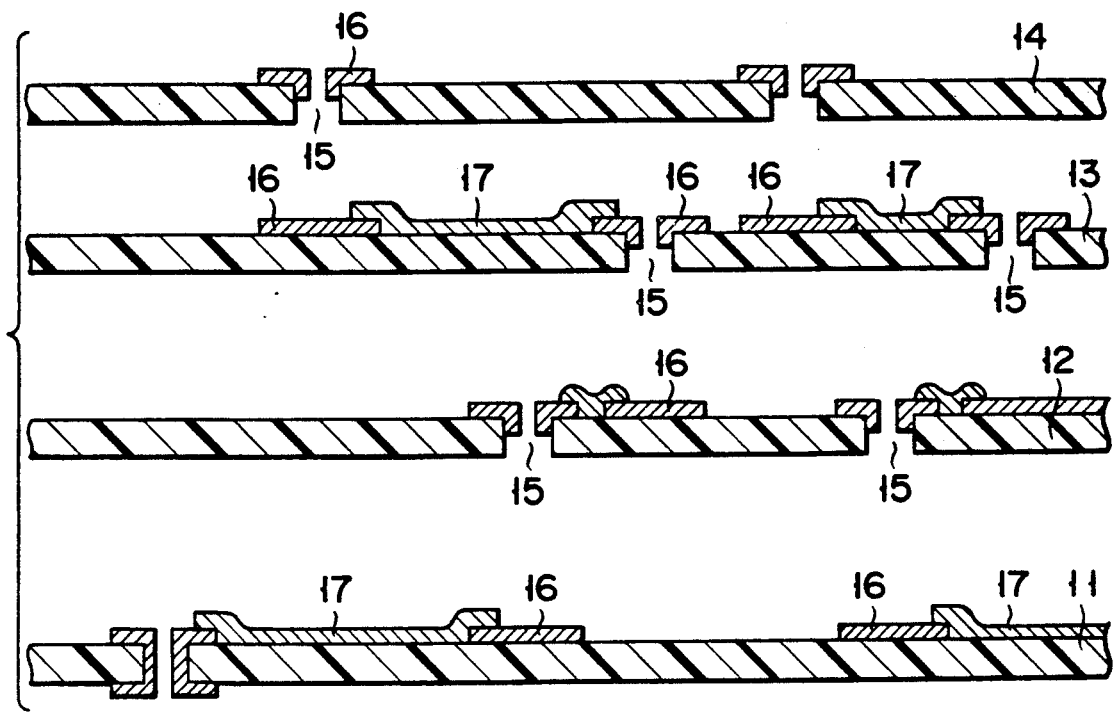
FIG. 1 is a cross-sectional view showing resin films constituting a circuit board according to an embodiment of the present invention.

An embodiment of the present invention will be described with reference to FIG. 1.

Resin films 11 to 14 have heat deformation properties. The thickness of each of the resin films is 50 μm. The material constituting the resin films is selected from heat deformation resin such as polycarbonate resin, polyvinyl chloride, polystyrene, saturated polyester resin, polyethylene resin, polypropylene, polyphenylene oxide, polysulfone resin, polyarylate resin and polyether sulfone resin. Through holes 15 each having a diameter of 0.3 mm are formed in through hole portions of the resin films 11 to 14.

First conductive patterns 16 made of thermoplastic resin are formed in the through holes 15 and on the major surfaces of the resin films 11 to 14 which directly contact the through hole portions. The first conductive patterns 16 are formed by printing conductive paste in which heat deformation resin, such as polycarbonate resin, polyvinyl chloride resin, polystyrene resin, saturated polyester resin, polyethylene resin, polypropylene resin, polyphenylene oxide resin, polysulfone resin, polyarylate resin and polyether sulfone resin, is used as binder.

Second conductive patterns 17 made of thermosetting resin are formed on the major surfaces of the resin films 11 to 14 which do not directly contact the through holes 15 or the through hole portions. Typical resin such as epoxy resin, unsaturated polyester resin, phenolic resin, and diallyl phthalate resin is used as the thermosetting resin. The connecting portions between the first and second conductive patterns overlap each other.

Figure 5:
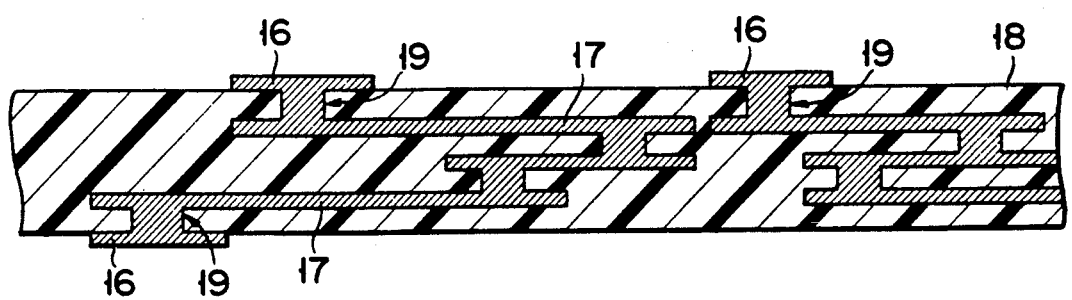
FIG. 5 is a cross-sectional view showing a circuit board according to another embodiment of the present invention, the circuit board being shown as a completed state.

The circuit board having the above-described structure is manufactured as follows. First, through holes 15 are formed in their prospective regions of resin films 11 to 14. Conductive paste using thermoplastic resin as binder is printed in the vicinity of the through holes of the resin film 11 to 14 to form first conductive patterns 16 and then conductive paste using thermosetting resin as binder is printed in portions of the resin films other than the through holes and their vicinities to form second conductive patterns 17. After the resin films are sequentially laminated in a proper state, they are interposed between the fixed plates (not shown) of a thermal press. The resin films are then heated and pressed at a predetermined pressure to be integrally formed. Thus a circuit board (see FIG. 5), including the first and second conductive patterns 16 and 17 connected together by through holes, is obtained.

In the circuit board according to the above embodiment, the first conductive patterns 16 are formed in the through holes 15 corresponding to the through hole portions of the resin films 11 to 14 and in portions directly connected to the through hole portions. The first conductive patterns 16 formed at the through hole portions are sufficiently deformed and are in close contact with each other when the resin films are thermally pressed, and a stable through hole connection can be attained. Since the second conductive patterns 17 made of thermosetting resin are formed on the other portions of the resin films 11 to 14, they are hardened by the thermal pressing operation and can be prevented from being greatly deformed. It is therefore possible to form the second conductivity patterns 17 with good controllability and to prevent adjacent conductive patterns 17 from being short-circuited. A circuit board having multilayer resin films can thus be manufactured at low cost, without such a complicated plating process required for manufacture of a glass epoxy board.

Figure 2:
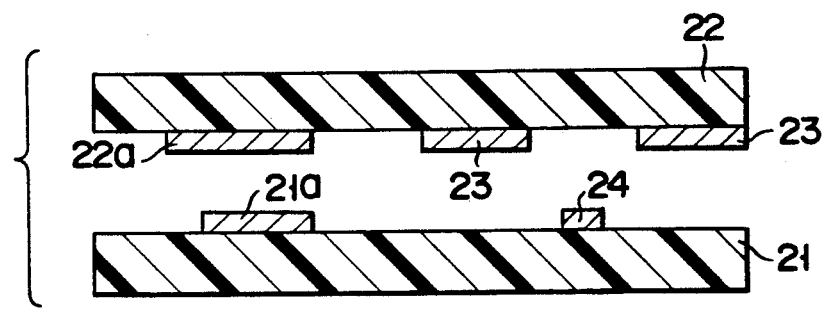
FIG. 2 is a cross-sectional view showing resin films constituting a circuit board according to another embodiment of the present invention.
Figure 3:
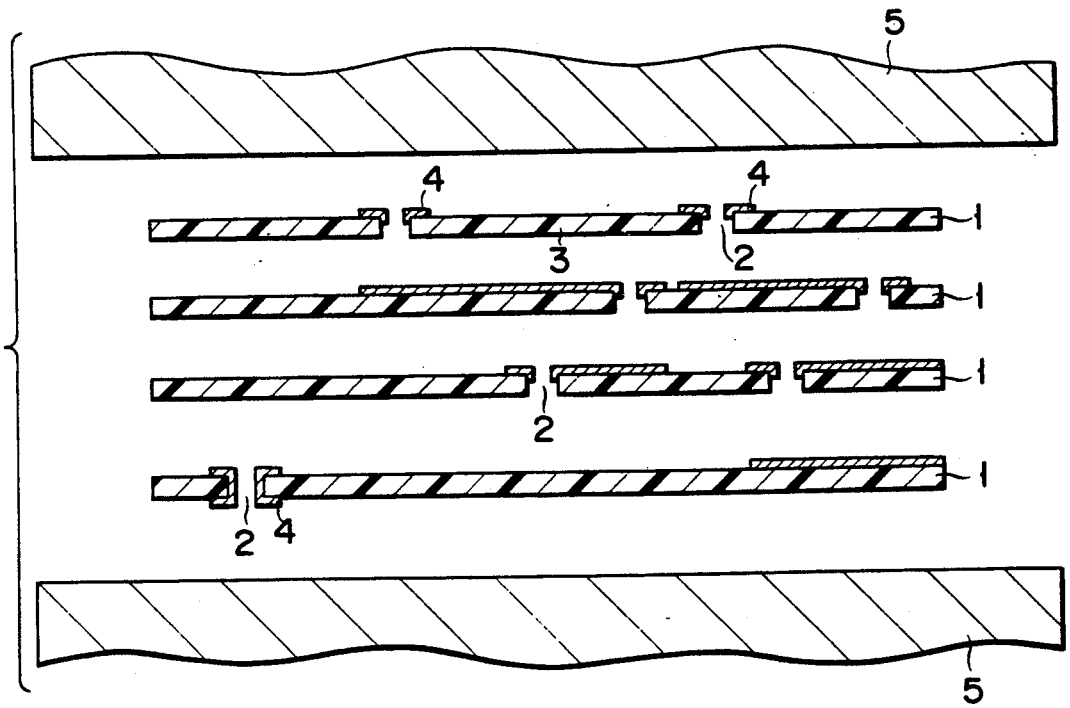
FIG. 3 (Prior Art) is a cross-sectional view showing resin films constituting a conventional circuit board.
Figure 4:
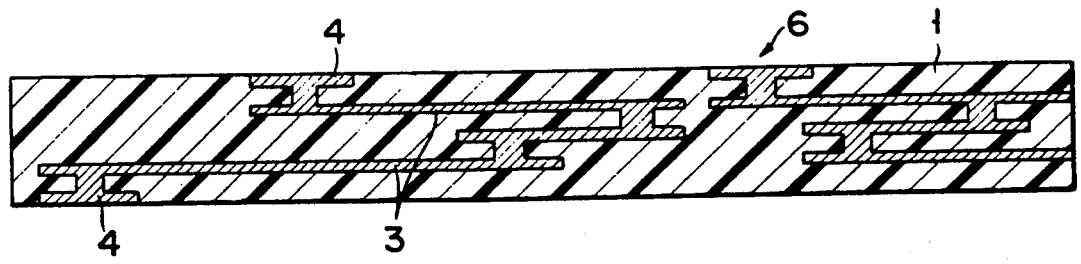
FIG. 4 (Prior Art) is a cross-sectional view showing the conventional circuit board in which the resin films have been laminated one on another.

The connecting portions are through holes in the above embodiment. However, as shown in FIG. 2, the connecting portions can be formed by forming conductive patterns 21a and 22a of thermoplastic resin on opposing surfaces of resin films 21 and 22 of heat deformation resin and connecting these conductive patterns by the thermal pressing operation. The conductive patterns 21a and 21b are connected to each other with good adhesion. Conductive patterns 23 and 24 of thermosetting resin can be prevented from being greatly deformed by the thermal pressing operation.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A circuit board with conductive patterns formed of conductive material and thermoplastic and thermosetting resins comprising:
   a plurality of resin film substrates in which films having heat deformation properties are laminated one upon the other;
   conductive patterns formed on at least one surface of each of said resin films; and
   connecting portions for electrically connecting said conductive patterns, said connecting portions being made of conductive material including thermoplastic resin, and said conductive patterns being made of conductive material including thermosetting resin.

2. The circuit board according to claim 1, wherein said connecting portions are through holes formed in said resin films.

3. The circuit board according to claim 1, wherein said conductive patterns are made of good conductive metal such as a material selected from the group consisting of Ag, Ni, Cu, Au and Pd.

4. The circuit board according to claim 1, wherein said resin films are made of resins selected from the group consisting of polycarbonate resin, polyvinyl chloride, polystyrene, saturated polyester resin, polyethylene resin, polypropylene, polyphenylene oxide, polysulfone resin, polyarylate resin, and polyether sulfone resin.

5. The circuit board according to claim 1, wherein said thermoplastic resin is selected from the group consisting of polycarbonate resin, polyvinyl chloride, polystyrene, saturated polyester resin, polyethylene resin, polypropylene, polyphenylene oxide, polysulfone resin, polyarylate resin, and polyether sulfone resin.

6. The circuit board according to claim 1, wherein aid thermosetting resin is selected from the group, consisting of resin, unsaturated polyester resin, phenolic resin, and diallyl phthalate.

* * * * *